(12) United States Patent
Li et al.

(10) Patent No.: US 11,417,736 B2
(45) Date of Patent: Aug. 16, 2022

(54) DUAL SHIELD OXIDE DAMAGE CONTROL

(71) Applicant: TEXAS INSTRUMENTS INCORPORATED, Dallas, TX (US)

(72) Inventors: Peng Li, Chengdu (CN); Ya ping Chen, Chengdu (CN); Yunlong Liu, Chengdu (CN); Hong Yang, Richardson, TX (US); Shengpin Yang, Chengdu (CN); Jing Hu, Chengdu (CN); Chao Zhuang, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/167,911

(22) Filed: Feb. 4, 2021

(65) Prior Publication Data

US 2022/0093754 A1 Mar. 24, 2022

Related U.S. Application Data

(63) Continuation of application No. PCT/CN2020/117461, filed on Sep. 24, 2020.

(30) Foreign Application Priority Data

Sep. 24, 2020 (WO) ................ PCT/CN2020/117461

(51) Int. Cl.
*H01L 29/40* (2006.01)
*H01L 29/423* (2006.01)
(Continued)

(52) U.S. Cl.
CPC .......... *H01L 29/407* (2013.01); *H01L 29/401* (2013.01); *H01L 29/4236* (2013.01); *H01L 29/66734* (2013.01); *H01L 29/7813* (2013.01)

(58) Field of Classification Search
CPC ... H01L 29/407; H01L 29/402; H01L 29/404; H01L 29/4236; H01L 29/66734;
(Continued)

(56) References Cited

U.S. PATENT DOCUMENTS 8,748,976 B1 * 6/2014 Kocon ................ H01L 29/7802
257/330
2013/0256787 A1 10/2013 Xie et al.
(Continued)

FOREIGN PATENT DOCUMENTS

| CN | 105009296 A | 10/2015 |
| CN | 105793993 A | 7/2016 |
| WO | 2019178765 A1 | 9/2019 |

OTHER PUBLICATIONS

Search Report, Application No. PCT/CN2020/117461, dated Jun. 24, 2021.

*Primary Examiner* — Joseph C. Nicely
(74) *Attorney, Agent, or Firm* — Andrew R. Ralston; Charles A. Brill; Frank D. Cimino

(57) ABSTRACT

A method (200) of fabricating a semiconductor device includes etching (205) a group of trenches in a semiconductor surface layer of a substrate. The group of trenches includes an outermost trench that has a first width and remaining trenches of the group of trenches have a second width that is less than the first width. The outermost trench is formed at an edge of the group of trenches. A dielectric liner is formed (210) in the group of trenches and the dielectric liner is etched (215) in an upper portion of the group of trenches to remove a partial thickness of the dielectric liner. A full thickness of the dielectric liner is maintained in a lower portion of the group of trenches. The group of trenches is filled (220) with a polysilicon layer.

21 Claims, 16 Drawing Sheets

(51) Int. Cl.
*H01L 29/78* (2006.01)
*H01L 29/66* (2006.01)

(58) Field of Classification Search
CPC ........... H01L 29/7813; H01L 29/66568; H01L 29/66575; H01L 29/7827
See application file for complete search history.

(56) References Cited

U.S. PATENT DOCUMENTS

| | | | |
|---|---|---|---|
| 2015/0357461 A1* | 12/2015 | Kawahara | H01L 29/66712 257/329 |
| 2016/0336394 A1 | 11/2016 | Hu et al. | |
| 2019/0296115 A1* | 9/2019 | Chen | H01L 29/404 |
| 2020/0212218 A1 | 7/2020 | Kim et al. | |

* cited by examiner

DUAL SHIELD OXIDE DAMAGE CONTROL

FIELD OF THE DISCLOSURE

Disclosed implementations relate generally to the field of semiconductor devices, and more particularly, but not exclusively, to improved formation of polysilicon shield arrays.

SUMMARY

Dual shield field plates refer to field plates in which the polysilicon in the field plates has different widths in two separate portions of the field plate, as differentiated from single shield field plates in which the polysilicon has a same width in all portions of the field plate. In order to prevent certain defects that occur during the fabrication of dual shield field plates that are intended to operate at higher voltages, e.g. 75 V or greater, depicted implementations increase the width of the outermost trench or trenches of the trenches in which the dual shield field plates are fabricated. While such implementations may be expected to improve the defect rate of such integrated circuits employing the dual shield field plates and improve device breakdown voltage performance and reliability, no particular result is a requirement of the described invention(s) unless explicitly recited in a particular claim.

In one aspect, an implementation of a method of fabricating a semiconductor device is disclosed. The method includes etching a group of trenches in a semiconductor surface layer of a substrate, the group of trenches including an outermost trench having a first width and remaining trenches of the group of trenches having a second width that is less than the first width, the outermost trench formed at an edge of the group of trenches; forming a dielectric liner in the group of trenches; etching the dielectric liner in an upper portion of the group of trenches to remove a partial thickness of the dielectric liner while maintaining a full thickness of the dielectric liner in a lower portion of the group of trenches; and filling the group of trenches with a polysilicon layer.

In another aspect, an implementation of a method of fabricating a semiconductor device is disclosed. The method includes etching a group of field plate trenches in a semiconductor surface layer of a substrate, the group of field plate trenches including an outermost field plate trench having a first width and remaining field plate trenches of the first group of trenches having a second width that is less than the first width, the outermost field plate trench formed on an edge of the group of field plate trenches; forming a dielectric liner in the group of field plate trenches; forming photoresist over the substrate including over the dielectric liner in the group of field plate trenches; exposing the photoresist in the group of field plate trenches; developing the photoresist to remove the photoresist in an upper portion of the group of field plate trenches, the photoresist remaining in a lower portion of the group of field plate trenches; etching the dielectric liner in the upper portion of the group of field plate trenches while the dielectric liner in the lower portion of the group of field plate trenches is protected by the photoresist; removing the photoresist from the lower portion of the group of field plate trenches; and filling the group of field plate trenches with a polysilicon layer.

In yet another aspect, an implementation of a semiconductor device is disclosed. The semiconductor device includes a group of polysilicon dual shield field plates formed in a semiconductor layer of a substrate, an outermost one of the dual shield field plates having a first width at a surface of the semiconductor layer and remaining ones of the dual shield field plates having a second width at a surface of the semiconductor layer that is less than the first width; and a polysilicon single shield field plate formed in the semiconductor layer and forming a terminating field plate, the outermost one of the dual shield plates located between the polysilicon single shield field plate and the remaining dual shield field plates, the single shield field plate having a third width at a surface of the semiconductor layer, the third width less than the first width.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct conductive connection unless qualified as in "communicably coupled" which may include wireless connections. Thus, if a first device couples to a second device, that connection may be through a direct conductive connection, or through an indirect conductive connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific implementations of the invention will now be described in detail with reference to the accompanying figures. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

U.S. Pat. No. 10,720,499 (hereinafter the '499 patent), which issued Jul. 21, 2020 in the name of Ya Ping Chen et al., and which is hereby incorporated by reference in its entirety, depicts the fabrication of polysilicon field plates in trenches etched into the substrate of a semiconductor wafer. One implementation of the '499 patent describes trenches in which a dielectric liner is formed in the trenches, e.g., by thermally growing a first oxide layer, followed by deposition of a second oxide layer using, e.g., sub-atmospheric chemical vapor deposition (SACVD). After filling the trenches with a photoresist, the photoresist can be patterned and developed such that the trenches that will form dual shield field plates have the photoresist removed from an upper portion of the trenches, while a lower portion of the trenches are still covered with the photoresist. Other portions of the substrate, which may include additional trenches, also remain covered with the photoresist. The exposed trenches are wet etched to remove the second oxide layer in the upper portion of the trenches, while the second oxide layer in the lower portion of the trenches is protected by the remaining photoresist. The photoresist can then be removed from the substrate, leaving trenches that have two different widths of dielectric liner, depending on the depth within the trench. The resulting trenches are filled with polysilicon to provide the desired configuration for the field plates.

In one implementation in the '499 patent, the dual shield field plates depicted were designed to operate at about 45 V and were etched to a depth of about 3 µm. When the methods described in the '499 patent were extended to dual shield field plates designed to operate at about 100 V, the depth of the trenches was increased to about 6 µm.

Figure 4A:
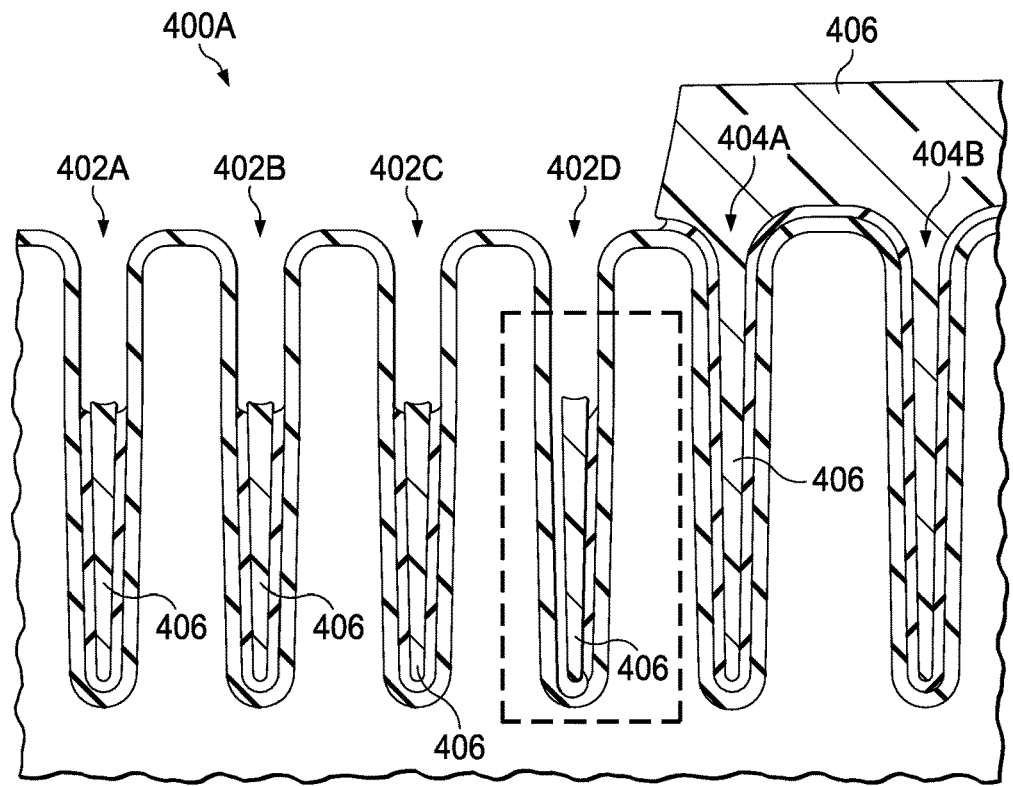
FIG. 4A depicts an identified problem seen in a cross-section of a group of trenches after a wet etch of the photoresist in the trenches.

FIG. 4A depicts a cross-section 400A through a group of trenches 402 and trenches 404 after completion of the wet etch described above in trenches having a depth of about 6 µm. The trenches 402 are being fabricated to serve as dual shield field plates, while the trenches 404 are not intended as dual shield field plates and remain covered with photoresist 406. Etching of the trench 402A, the trench 402B, and the trench 402C has proceeded as desired, while an issue has been identified in the trench 402D. The photoresist 406 in the trench 402D has pulled away from one wall of the trench 402D, allowing the etchant to attack the exposed wall.

Figure 4B:
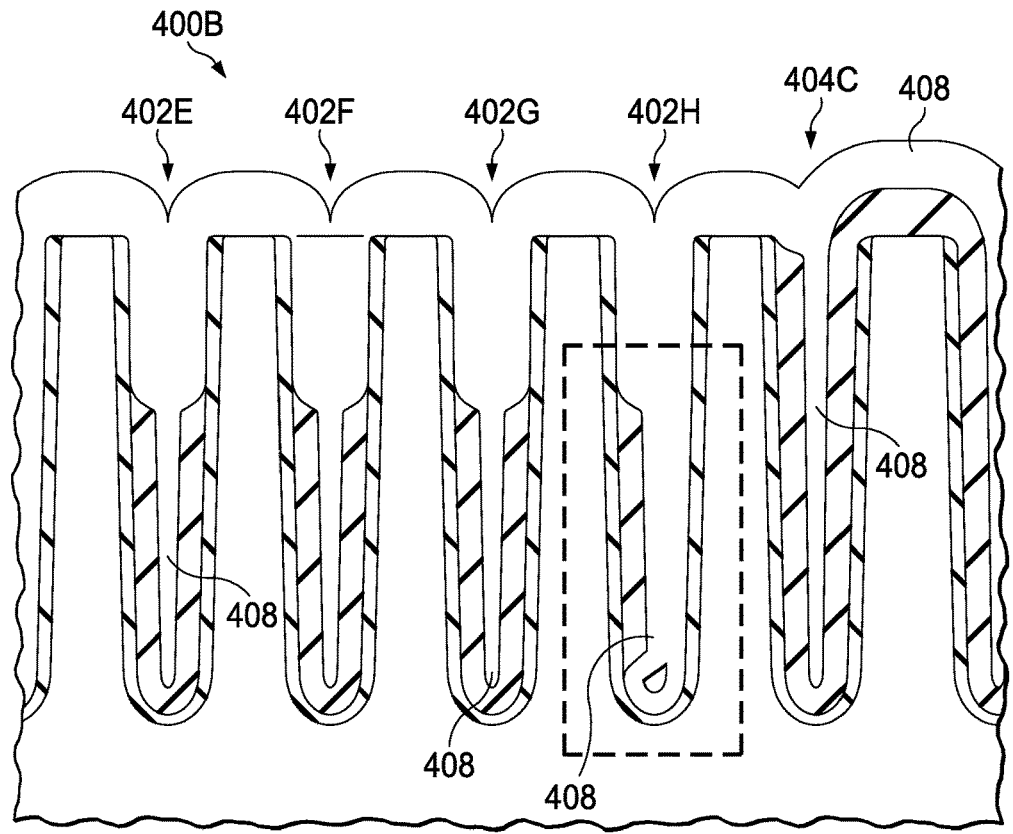
FIG. 4B depicts an identified problem seen in a cross-section of a group of trenches after polysilicon has been formed in the trenches.

FIG. 4B depicts a cross-section 400B through a similar group of the trenches 402 and the trenches 404 after the photoresist 406 has been removed from the substrate and polysilicon 408 has been formed in each of the trenches 402 and the trenches 404. The trench 402E, the trench 402F, and the trench 402G all provide a dual shield field plate that can operate as desired, but the trench 402H does not provide the desired shape and includes a defect that may affect operation of the chip. The problem of the photoresist 406 pulling away from one wall of the trench 402D in FIG. 4A and causing the resulting misshapen dual shield field plate in the trench 402H of FIG. 4B was only identified in the outermost trench 402.

Figure 5A:
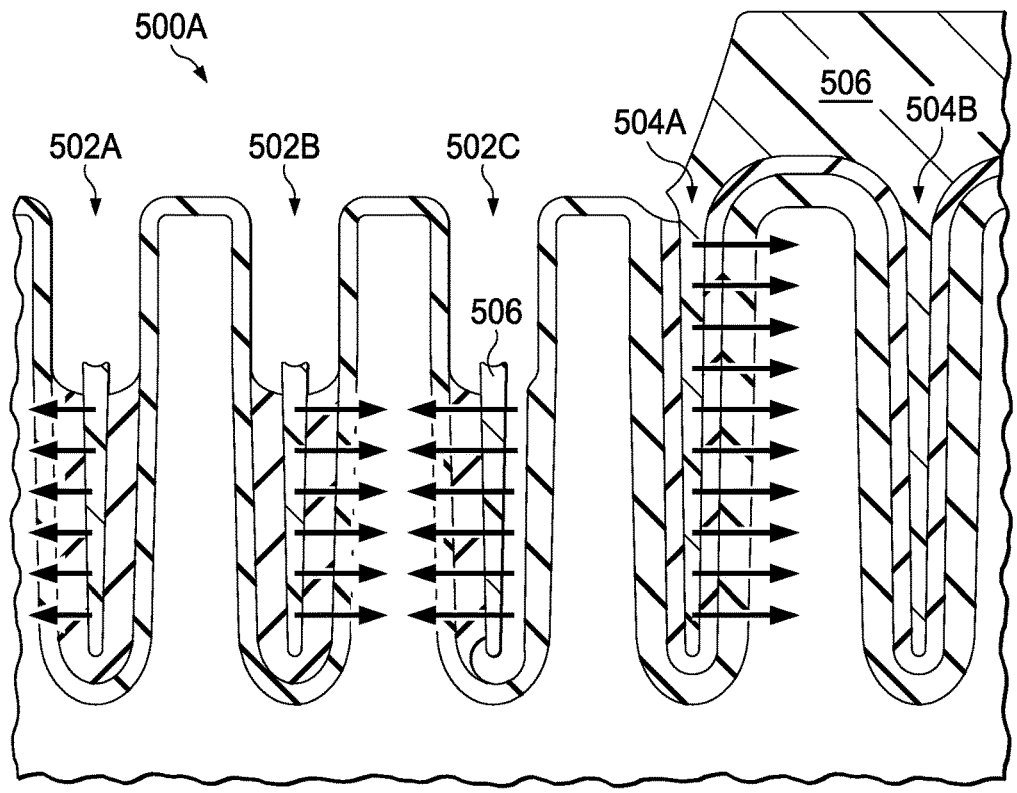
FIG. 5A depicts the stresses acting on the trenches during the baking process to harden the photoresist.

FIG. 5A depicts the stresses in a cross-section 500A of a substrate after the wet etch to remove the second oxide layer from an upper portion of trenches 502, which are intended as dual shield field plates; additional trenches 502 (not specifically shown) are located to the left of the depicted trenches 502. As a trench 502A and a trench 502B are etched, the localized stress around these trenches remains evenly balanced due to the similar etching occurring on either side of the trench 502A and the trench 502B. However, as a trench 502C is etched, the localized stress in the trench 502C increases because the photoresist and the silicon oxide are being removed from the trench 502B, but not from the trench 504A. This imbalance in the forces acting on the trench 502C appears to be the cause of photoresist 506 pulling away from one wall of the trench 502C, which results in an incorrectly formed dual shield field plate.

Figure 5B:
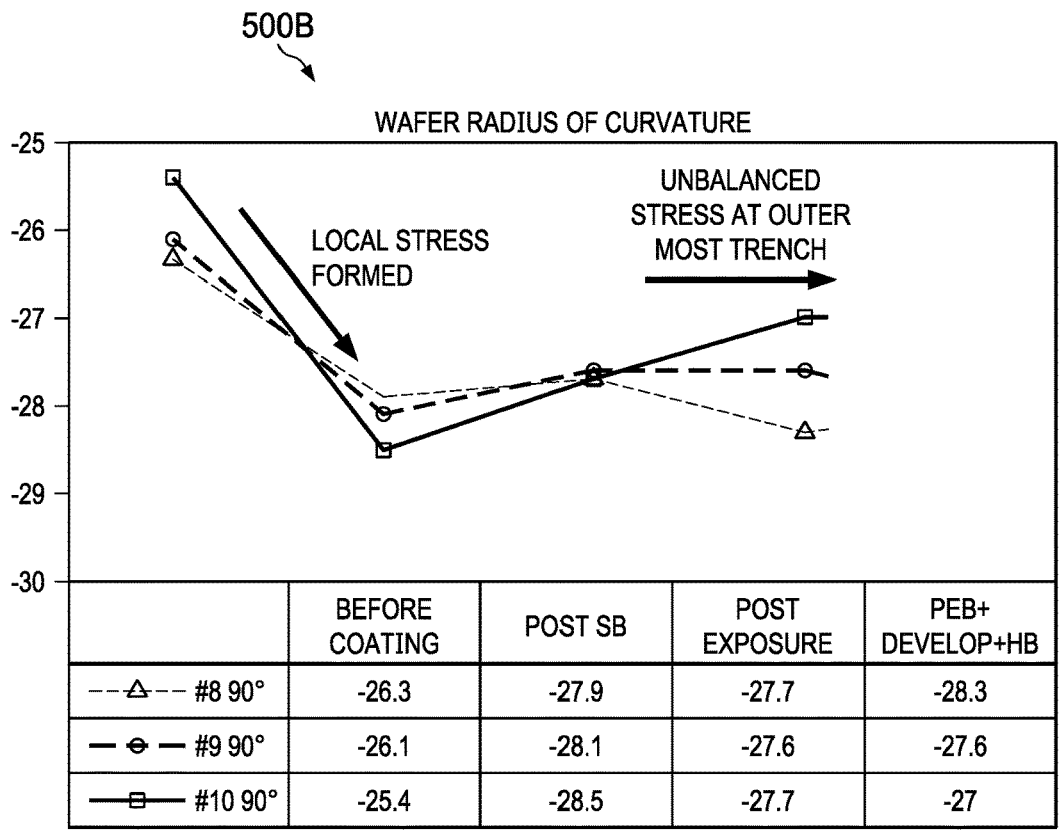
FIG. 5B provides a graph that shows the changes in stress on the wafer at several points during fabrication.

FIG. 5B depicts a graph 500B showing the changes in the wafer radius of curvature across several elements of fabrication. The radius of curvature can be an indicator of stress, which is increased by the high density of the trench pattern in this application. It is known that the greater the radius of curvature, the less stress is present. The three lines are the results for three different wafers, demonstrating the differences that can occur between wafers. The left side of the graph 500B begins after the formation of the second silicon oxide layer, which in this implementation was deposited by SACVD. At this point, the wafer top surface has a compressive stress and radius of curvature around 26 arbitrary units.

The second point was taken after formation of the photoresist in the trenches and a soft bake to remove liquid from the photoresist. The soft bake generates tensile stress on the front side of the wafer, increasing the wafer radius of curvature to about 28. The third point was determined after exposure of the pattern to light. The exposure changes the chemical characteristics of the photoresist in the upper portions of the exposed trenches, e.g., the trenches for dual shield field plates. This decreases the tensile stress, so the wafer becomes more compressive compared to the second point.

A fourth point in graph 500B is taken after a post-exposure bake and development of the photoresist, followed by a hard bake, which can be performed, e.g., at 110° C. The removal of photoresist from the substrate surface and from upper portions of some, but not all, trenches can continue to release tensile stress and provide greater compressive stress, and are believed to cause the identified photoresist pullback.

Figure 6B:
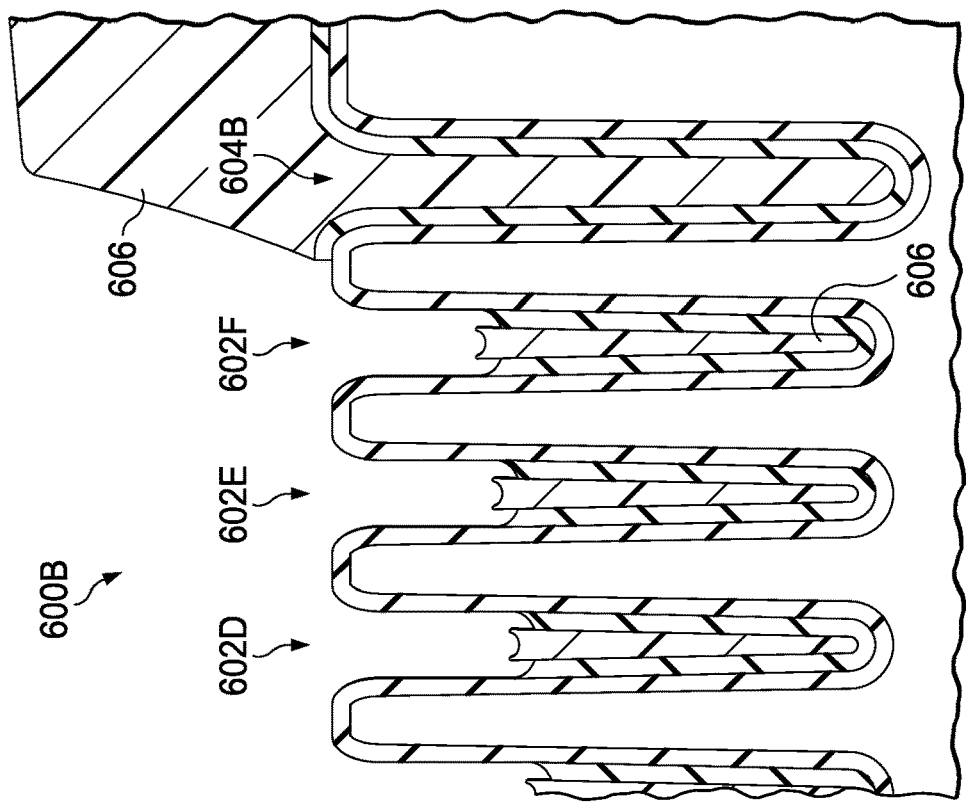
FIG. 6A and FIG. 6B depict similar groups of trenches that have been subject to a wet etch of the photoresist to different depths.
Figure 6A:
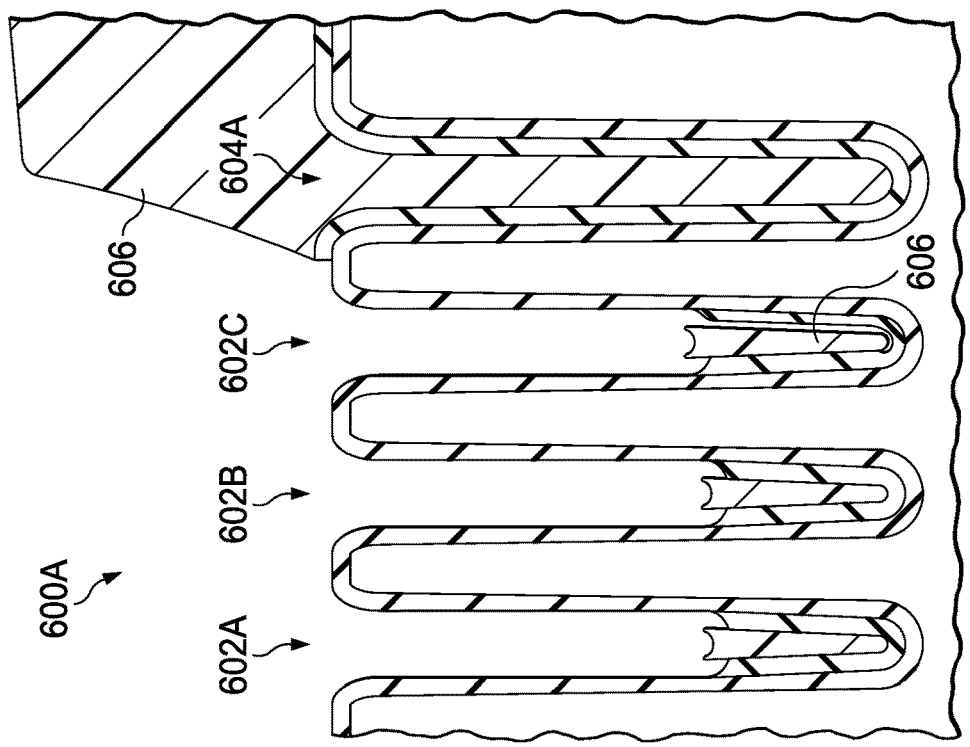

FIG. 6A and FIG. 6B depict a cross-section 600A and a cross-section 600B respectively of a group of trenches having similar depths of about 3.5 µm. The cross-sections are shown after removal of the photoresist and partial removal of the upper trench oxide using a wet etch and compares the results of leaving different levels of photoresist in the trenches. FIG. 6A depicts a trench 602A, a trench 602B, and a trench 602C, which have been wet etched to a depth of about 2400 nm, while a trench 604A has not been etched. The trench 602A and the trench 602B have been successfully etched, but in the trench 602C the photoresist 606 is again shown to have pulled away from one sidewall. In contrast, FIG. 6B depicts a trench 602D, a trench 602E, and a trench 602F that have been wet etched to a lesser depth of about 1030 nm, leaving a greater amount of photoresist in the trenches; a trench 604B has not been etched. The imbalance of stress at the trench 602F has not reached a point that has triggered photoresist pull-back. Thus, the depth of the photoresist remaining in the trench can affect the photoresist pullback during the wet etch.

Figure 7B:
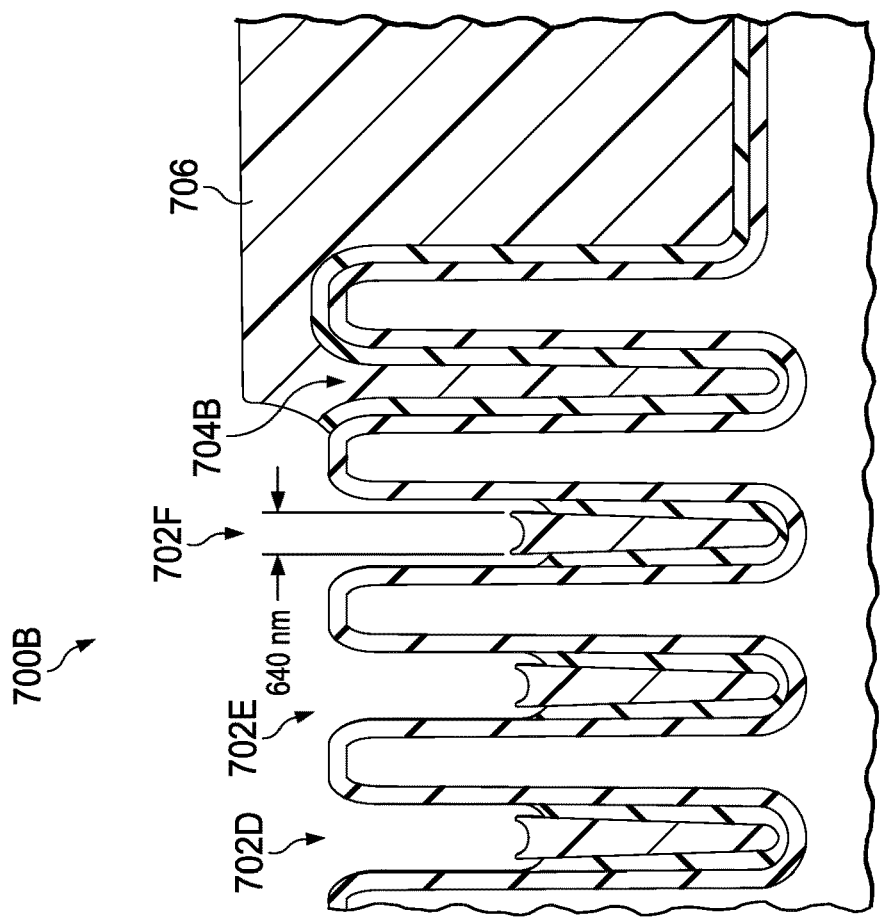
FIG. 7A and FIG. 7B depict similar groups of trenches after wet etch of the photoresist with different widths of photoresist remaining in the lower portion of the trenches.
Figure 7A:
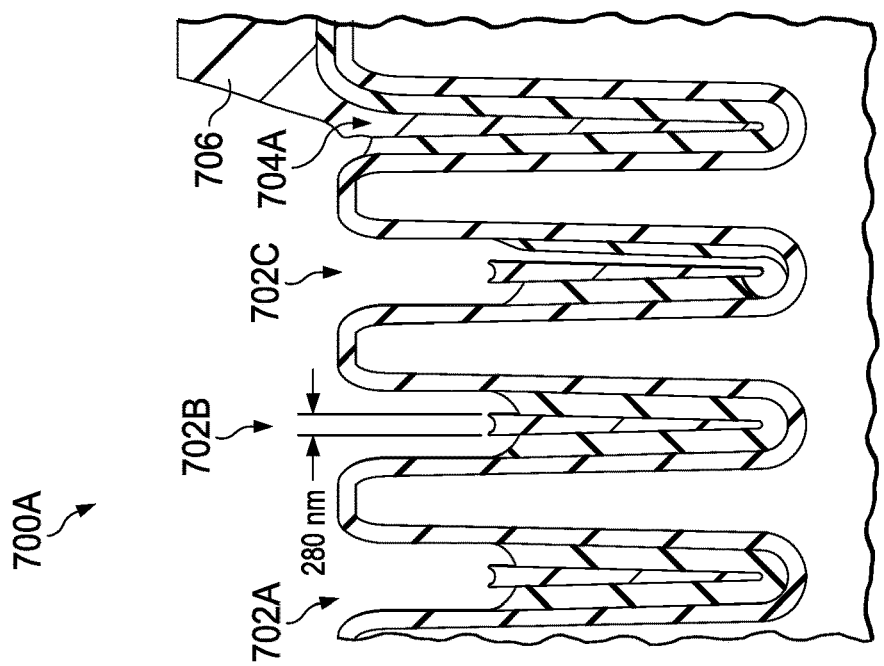

FIGS. 7A and 7B depict respective cross-sections of a substrate after the wet etch. Each cross-section shows a group of trenches having similar depths of about 6 μm but having different thicknesses of the second silicon oxide layer and thus different widths in the lower portion of the trenches. A cross-section 700A includes a trench 702A, a trench 702B, and a trench 702C, each of which has been etched; a trench 704A has not been etched. Each of the trench 702A, the trench 702B, and the trench 702C has resulted in a photoresist cross-section width of about 280 nm. In the cross-section 700A, the trench 702A and the trench 702B were etched normally, although the trench 702C shows photoresist pull-back from the wall and a distinct defect in the resulting trench.

A cross-section 700B includes a trench 702D, a trench 702E, and a trench 702F, each of which has been etched; a trench 704B has not been etched. Each of the trench 702D, the trench 702E, and the trench 702F has resulted in a photoresist cross-section width of about 640 nm. In a cross-section 700B, all of the trenches 702 have been successfully etched without defects, demonstrating that the width of photoresist in the lower portion of the trench can also affect the photoresist pullback during the wet etch.

The Applicant has determined that in order to minimize defects in integrated circuit (IC) chips that include trenches for dual shield field plates that will operate at 75 V or greater, e.g., 100 V, fabrication can include an outermost trench for dual shield field plates that has a width greater than the width of the remaining trenches for dual shield field plates. It will be recognized that while the present application refers to an outermost trench, where a number of trenches are arranged to form rows, there may be, e.g., an outermost trench at each end of the rows. The described strategy allows for a greater width in the lower portion of the outermost trench, so that photoresist pullback may be reduced or eliminated, yet minimally increases the size of the chip. In one implementation, the width of this outermost trench is 1.5-2.5 times greater than the width of the remaining trenches.

FIG. 1A through FIG. 1H depict respective cross-sections of a semiconductor device 100 at various points in the fabrication of power metal-oxide-semiconductor field effect transistors (MOSFETs) that includes field plates. Field plates often function to reduce an electric field in an adjacent semiconductor region. A field plate may be for example a semiconductor region with an opposite conductivity type from the adjacent semiconductor region. The process described herein depicts N-type metal oxide semiconductor (NMOS) FETs, although it should be clear to one having ordinary skill in the art to use the information in these descriptions to also form P-type metal oxide semiconductor (PMOS) transistors. This can be accomplished by substituting n-doped regions for p-doping and vice versa so that examples can also include PMOS transistors.

Figure 1A:
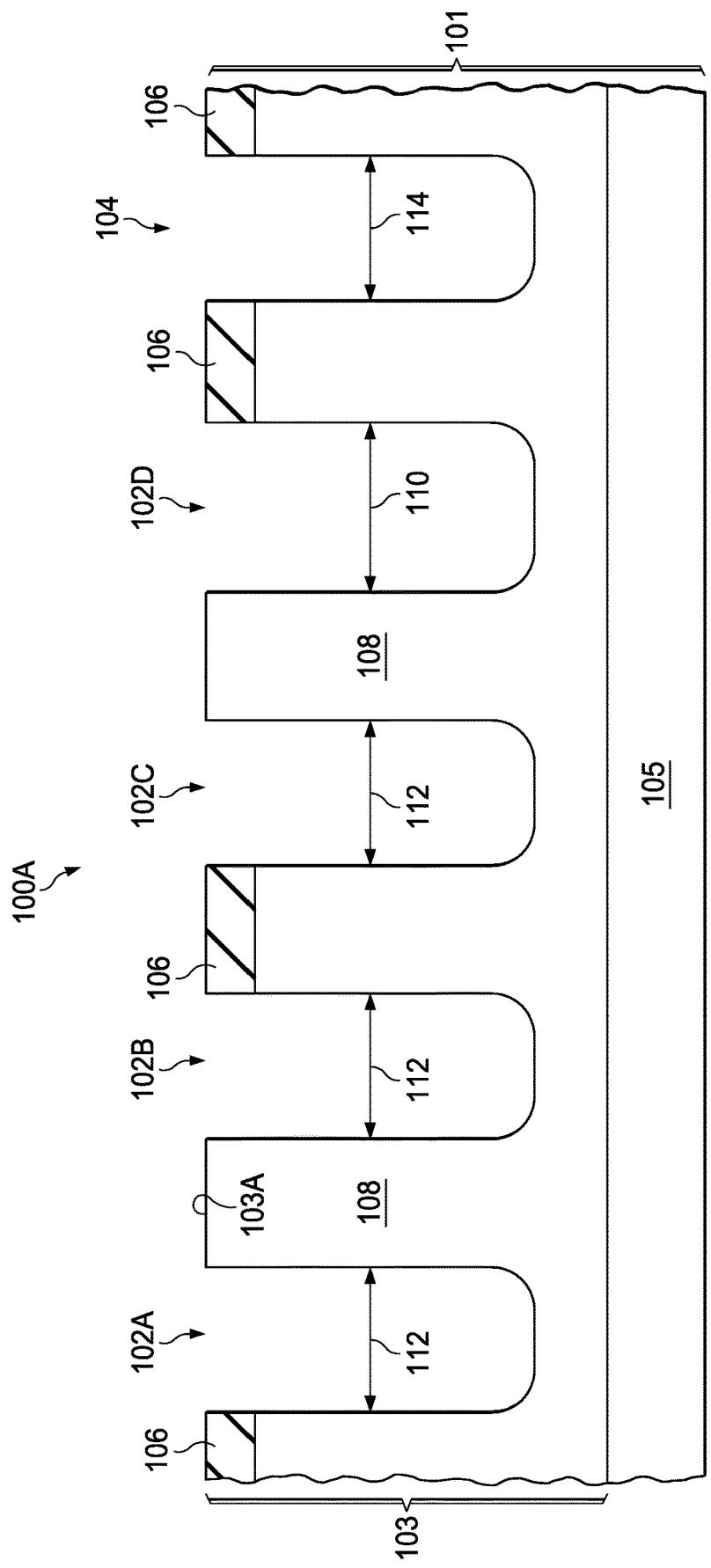
FIG. 1A through FIG. 1H depict respective cross-sections of a semiconductor device at various stages during fabrication according to an implementation of the disclosure.

FIG. 1A depicts a cross-section of a semiconductor device 100A that is in fabrication in and over a substrate 101. The substrate 101 includes a semiconductor surface layer 103, which extends to a top surface 103A, and an N+ region 105 below the semiconductor surface layer 103. A group of trenches 102, which includes a field plate trench 102A, a field plate trench 102B, a field plate trench 102C, and a field plate trench 102D, have been formed in semiconductor surface layer 103. In the implementation of semiconductor device 100, a termination trench 104 has also been formed. The field plate trench 102A, the field plate trench 102B, the field plate trench 102C, and the field plate trench 102D will be used to form dual shield field plates. The termination trench 104, which in one implementation is optional, is a feature designed for the outer edge of the device (e.g., on a die) to ensure that when voltage is applied to the device the device does not experience a premature voltage breakdown occurring at its outer edge. In one implementation, the termination trench 104 is a single shield field plate.

Additional field plate trenches 102 are generally formed in the semiconductor surface layer 103, e.g., to the left of the field plate trenches 102 shown in the semiconductor device 100A; the field plate trench 102D is the outermost of the field plate trenches and is formed on an edge of the field plate trenches 102. In one implementation, several hundred field plate trenches 102 are provided in a semiconductor surface layer 103. In the semiconductor device 100A, once the field plates are completed, a power MOSFET may be formed between the current field plate trench 102A and the field plate trench 102B; a MOSFET may also be formed between the field plate trench 102C and the field plate trench 102D.

A field oxide 106 has been formed between the field plate trench 102B and the field plate trench 102C, between the field plate trench 102D and the termination trench 104, and in other regions of the semiconductor surface layer 103. The field oxide 106 may be formed by a shallow trench isolation (STI) process, as shown in FIG. 1A, or by a local oxidation of silicon (LOCOS) process. Several N-type vertical drift regions 108 have also been formed in the semiconductor surface layer 103, e.g., between the field plate trench 102A and the field plate trench 102B and also between the field plate trench 102C and the field plate trench 102D.

In order to decrease or eliminate the defects previously seen in the outermost field plate trench 102D, field plate trench 102D has a first width 110, while the field plate trench 102A, the field plate trench 102B, and the field plate trench 102C each have a second width 112 that is less than the first width 110. In one implementation, the first width 110 is 1.5 times the second width 112; in another implementation, the first width 110 is 2.0 times the second width 112; in still another implementation, the first width 110 is 2.5 times the second width 112. Termination trench 104 has a third width 114, which in one implementation is equal to the second width.

In one implementation of the semiconductor device 100A, which may be designed to operate at 100 V, the field plate trenches 102 and the termination trench 104 may be 6 μm to 7 μm deep; the field plate trenches 102 and the termination trench 104 may be 1.2 μm to 1.4 μm wide, with the exception of the field plate trench 102D, which may be 1.8 μm to 3.5 μm wide. The vertical drift region 108 may be 2.0 μm to 2.4 μm wide, and have an average doping density of about 4e16 atoms/cm$^3$ to about 6e16 atoms/cm$^3$.

Figure 1B:
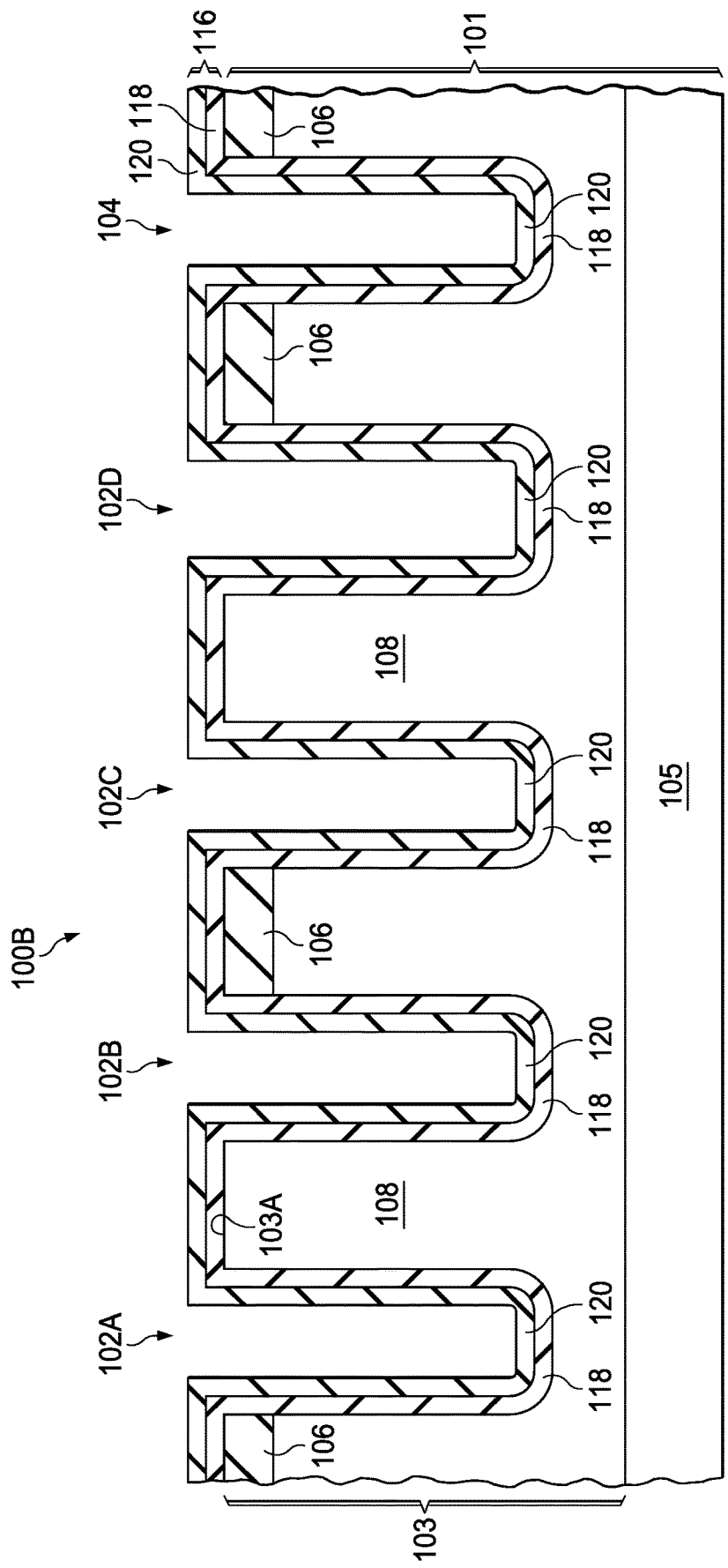

FIG. 1B depicts a cross-section of semiconductor device 100B after the formation of a dielectric liner 116 on the top surface 103A of the semiconductor surface layer 103 and on the sidewalls and bottom of the field plate trenches 102 and the termination trench 104. In one implementation, the dielectric liner 116 includes a first dielectric layer 118, e.g., a thermally grown oxide layer, and a second dielectric layer 120, e.g., a deposited silicon dioxide layer, formed on the first dielectric layer 118. In one implementation, the first dielectric layer 118 may be 50 nm to 300 nm thick. In one implementation, the first dielectric layer 118 may be 80 nm to 150 nm thick. In one implementation, the second dielectric layer 120 may be 80 nm to 500 nm thick, such as being 80 nm to 200 nm thick, or 150 nm to 200 nm thick. The second dielectric layer 120 may be formed by an SACVD process using dichlorosilane and oxygen. Alternately, the second dielectric layer 120 may be formed by a plasma enhanced chemical vapor deposition (PECVD) process using tetraethyl orthosilicate, also known as tetraethoxysilane (TEOS). The second dielectric layer 120 may be subsequently densified in an anneal step.

Figure 1C:
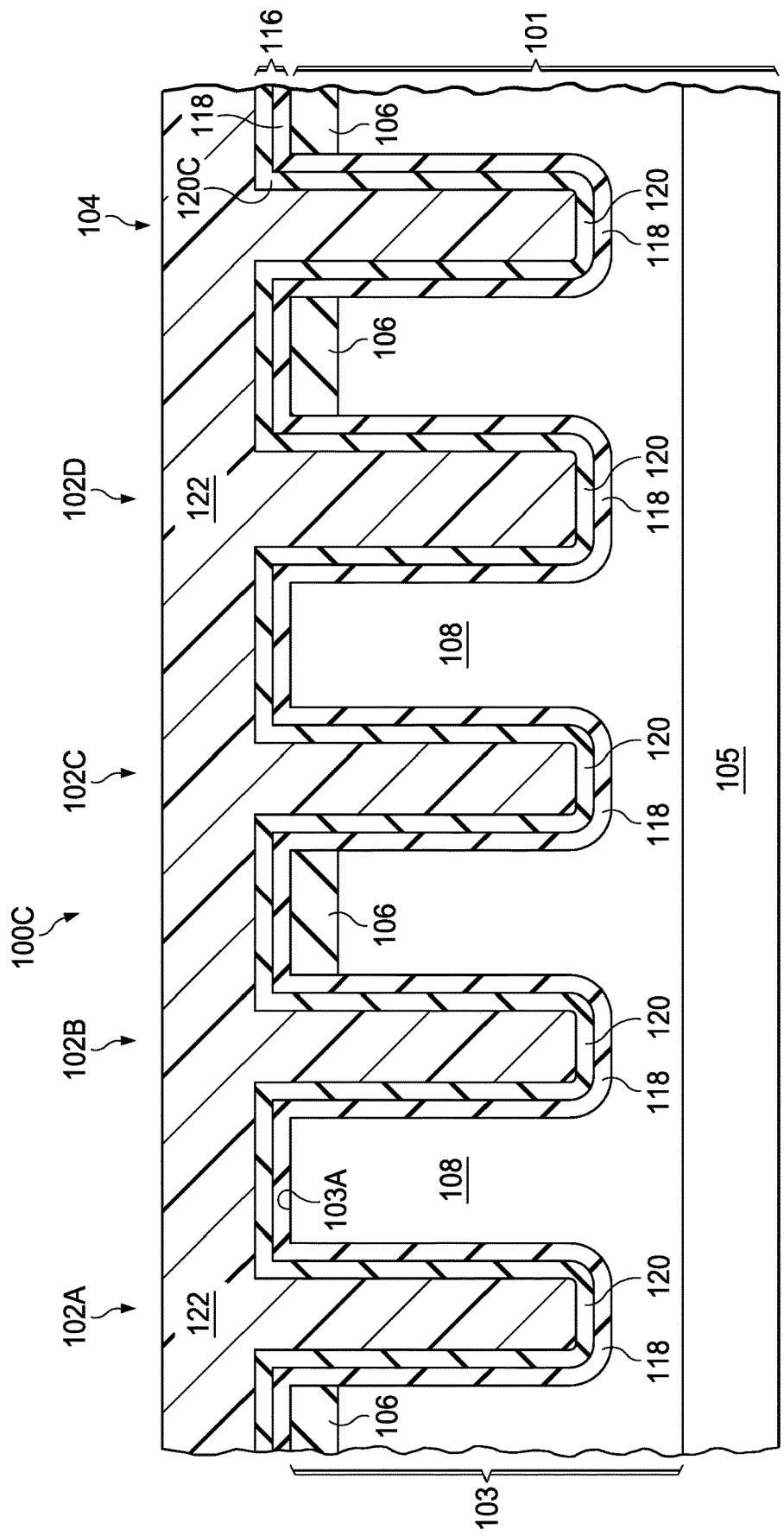
Figure 1D:
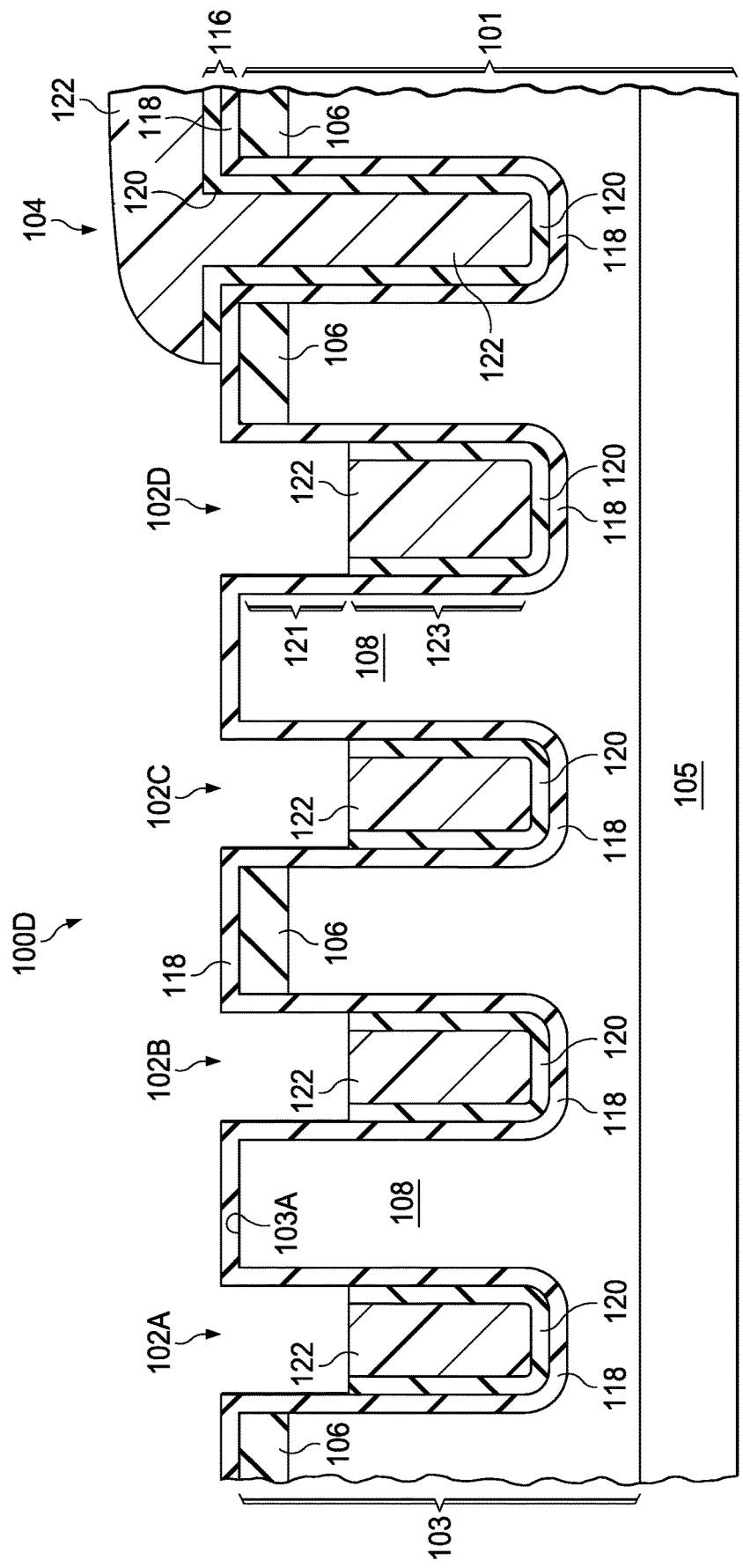

FIG. 1C depicts a cross-section of a semiconductor device 100C after formation of a photoresist layer 122. The photoresist layer 122 generally includes a liquid and is used to coat the top surface 103A and to fill the field plate trenches 102 and the termination trench 104. Once the photoresist layer 122 has been applied to the substrate 101, a soft bake is performed to remove solvent from the photoresist layer 122. FIG. 1D depicts a cross-section of a semiconductor device 100D after exposing the photoresist layer 122 with a mask and then partially removing the photoresist layer 122 so that the photoresist layer 122 is removed in an upper portion 121 of the field plate trenches 102, while not removing the photoresist layer 122 over the termination trench 104. Exposed portions of the second dielectric layer 120 are etched to remove the second dielectric layer from the upper portion 121 of the field plate trenches 102. The etchant may be selected to stop on the first dielectric layer 118. In the lower portion 123 of the field plate trenches 102, the second dielectric layer 120 and the first dielectric layer 118 are both protected during this etch by the photoresist layer 122, as is the termination trench 104.

The photoresist layer 122 can be a positive photoresist, which as is known in the art is degraded by light so that a developer can dissolve away the regions that were exposed to light, leaving behind a coating where the mask was placed. The thickness of the photoresist layer 122 applied may be a function of the trench depth (and width or area) to ensure complete trench filling. After developing, the photoresist layer 122 generally remains in 20% to 80% of the depth of the field plate trenches 102, but is not removed in the termination trench 104. The target may be to leave 50%+/−10% of the depth of photoresist layer 122 in the field plate trenches 102.

The etching of the second dielectric layer 120 in the upper portion 121 of the field plate trenches 102 can comprise a wet etch. The wet etch can comprise using a buffered hydrofluoric acid (HF) solution. An example buffered HF solution is 10 parts of 40 percent ammonium fluoride in deionized water and 1 part of 49 percent HF in deionized water. This example buffered HF etch exhibits an etch rate for densified SACVD silicon dioxide that is more than twice an etch rate for thermal oxide.

The etching of the second dielectric layer 120 in the upper portion 121 of the field plate trenches 102 can also comprise a dry etch. If dry etching is used, the dielectric liner 116 can be a dielectric stack (not specifically shown) comprising a bottom layer of silicon oxide, a layer of silicon nitride on the bottom layer, and a top layer of silicon oxide. An example dry etch for this purpose is a high selectivity carbon/fluorine-based plasma etch using an RF power of 1200 W with 12 standard cubic centimeters per minute (sccm) $C_4F_8$, 5 sccm $O_2$, 100 sccm Ar, 95 sccm CO, using a 200 second etch time. The etch time used generally depends on the target depth. This plasma etch can provide an etch rate of oxide/silicon nitride of greater than 10 and an etch rate of silicon oxide/silicon of greater than 10. This plasma etch can stop on silicon nitride and avoid silicon damage.

Figure 1E:
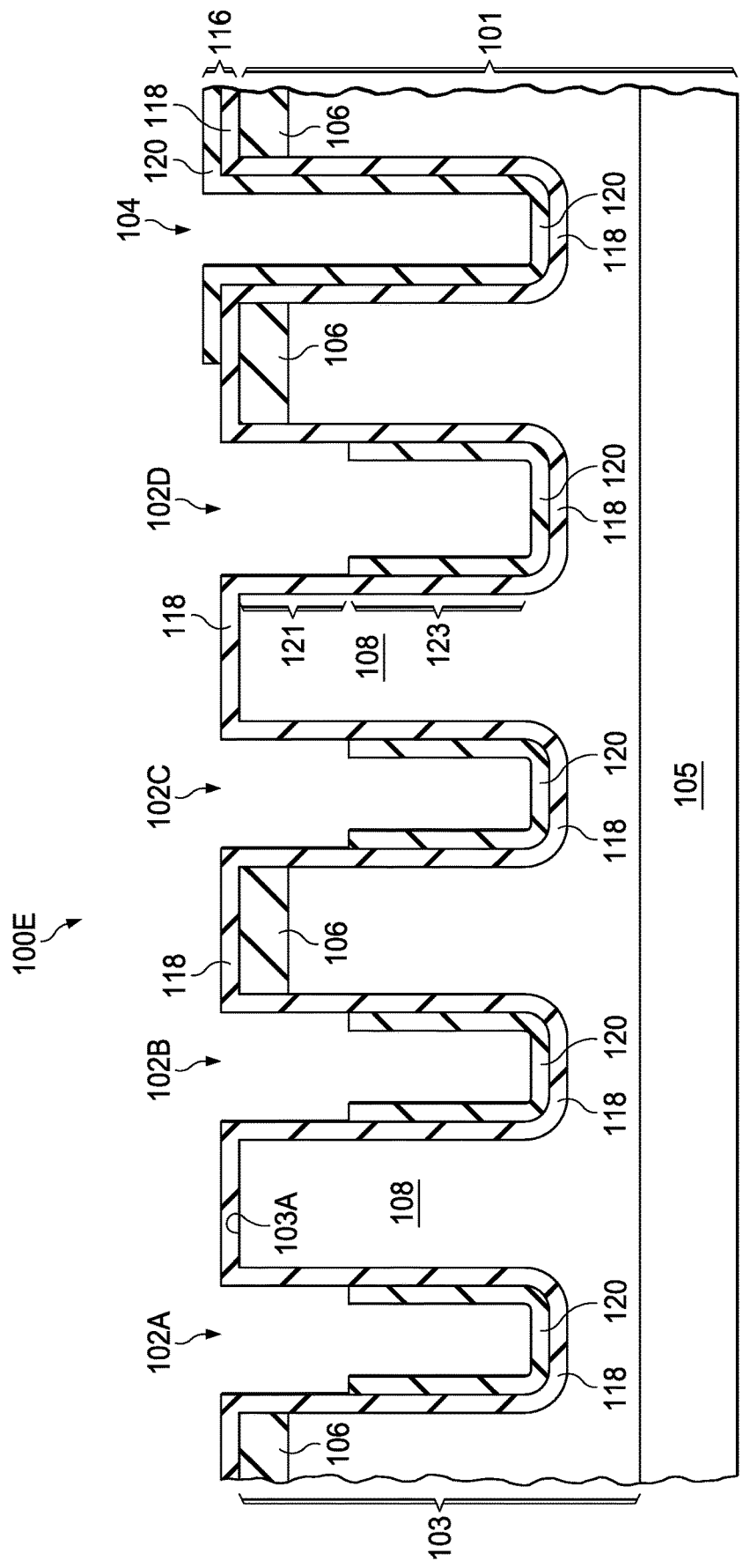

FIG. 1E depicts a cross-section of a semiconductor device 100D after the photoresist layer 122 is stripped. Each of the field plate trench 102A, the field plate trench 102B, the field plate trench 102C, and the field plate trench 102D now has only the first dielectric layer 118 in the upper portion 121 of the trench and both the first dielectric layer 118 and the second dielectric layer 120 in the lower portion 123 of the trench. The termination trench 104 includes both the first dielectric layer 118 and the second dielectric layer 120 throughout the depth of the trench.

Figure 1F:
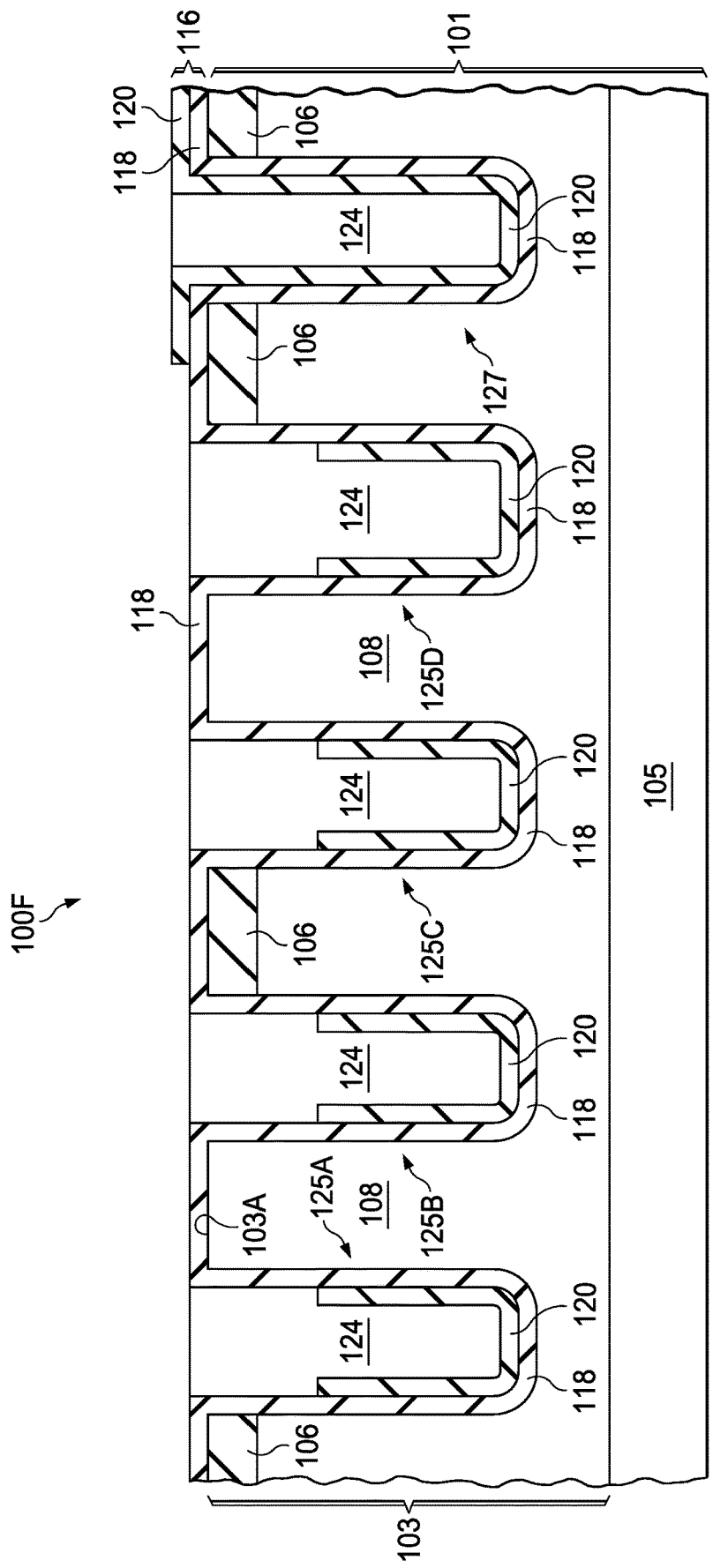

FIG. 1F depicts a cross-section of a semiconductor device 100F after forming a polysilicon layer 124 to fill the field plate trenches 102 and the termination trench 104. Formation of the polysilicon layer 124 is followed by etching to remove excess polysilicon. Chemical mechanical polishing (CMP) may be used for the polysilicon removal. The polysilicon layer 124 may be for example, 500 nm to 700 nm thick over the top surface 103A as formed. The polysilicon layer 124 may be doped in-situ, for example with phosphorus, to have an average doping density of about 1e18 atoms/cm$^3$ to about 5e18 atoms/cm$^3$. Alternatively, the polysilicon layer 124 may be doped by ion implanting dopants, for example phosphorus, at a dose of about 1e14 atoms/cm$^2$ to about 1e16 atoms/cm$^2$, and subsequently annealed between about 900° C. and about 1000° C. for 10 to 60 minutes.

As seen in semiconductor device 100F, removal of the polysilicon layer 124 overburden has produced dual shield field plates 125A . . . 125D in the field plate trenches 102 and a single shield field plate 127 in the termination trench 104. In some contexts the dual shield field plate 125D may be referred to as an outermost dual shield field plate 125, and the single shield field plate 127 may be referred to as a terminating field plate 127. As seen, the outermost dual shield field plate 125D is located between the terminating field plate 127 and remaining ones of the dual shield field plates 125, e.g. the dual shield field plates 125A . . . 125C.

In the described implementations, respective power MOSFETs are formed next between the dual shield field plate 125A and the dual shield field plate 125B, and also between the dual shield field plate 125C and the dual shield field plate 125D. In one implementation, the power MOSFETs are vertical trench gate MOSFETs. In one implementation, the power MOSFETs are planar gate MOSFETs. Examples of both vertical trench gate MOSFETs with the described dual shield field plates 125 and planar gate MOSFETs with the described dual shield field plates 125 are shown respectively in FIG. 1G and FIG. 1H. Additional details of the formation of the vertical trench gate MOSFET may be found in the '499 patent.

Figure 1G:
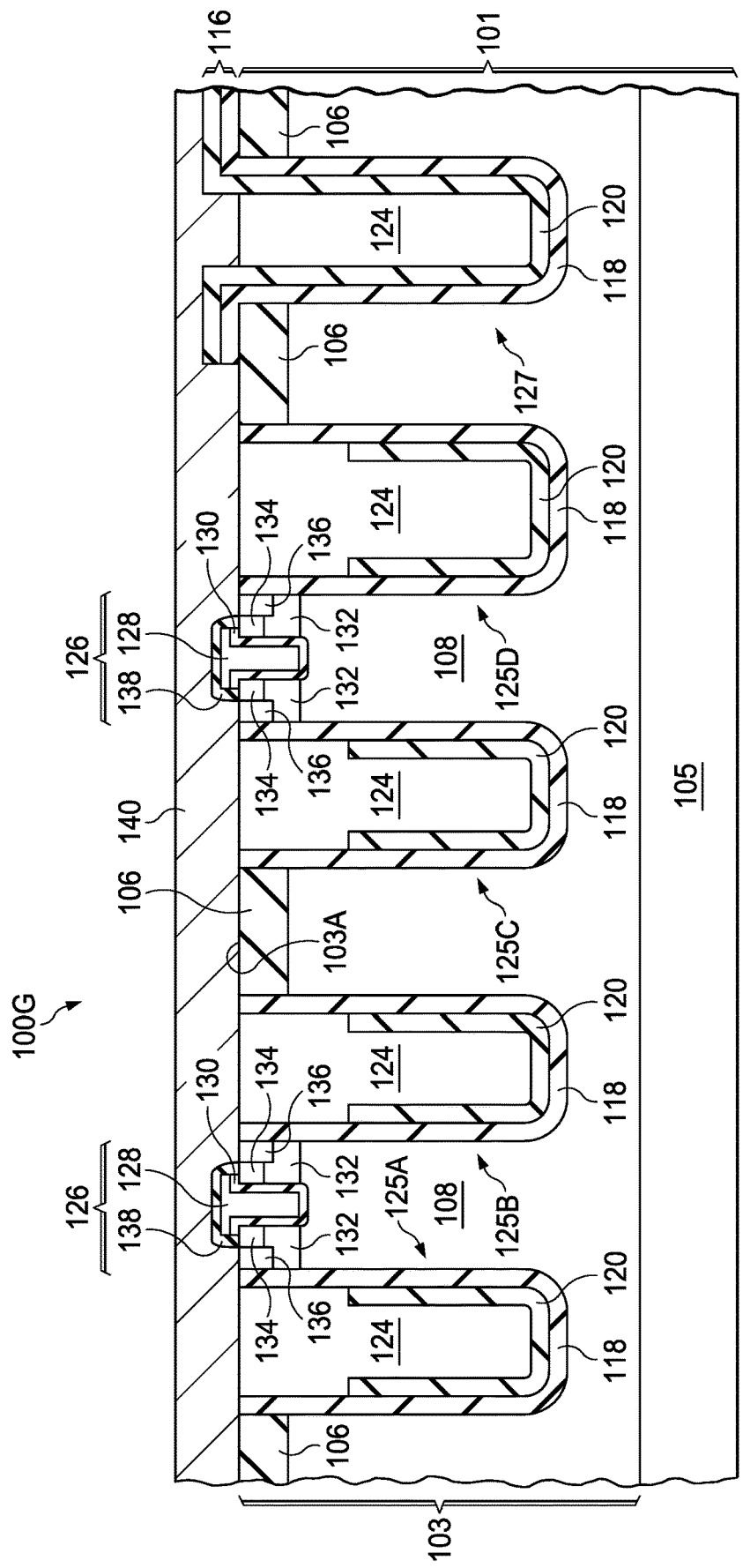

FIG. 1G depicts a cross-section of a semiconductor device 100G in which vertical trench gate MOSFETs 126 have been formed between respective pairs of the dual shield field plates 125. Each vertical trench gate MOSFET 126 includes the N+ region 105, which forms a drain contact region and a respective N-type vertical drift region 108. A gate electrode or gate 128 is disposed on a gate dielectric layer 130 that contacts a p-body region 132. The gate 128 is laterally separated from each adjacent field plate 125 by the semiconductor material of the substrate 101. In one implementation, the gate 128 can also be formed within the field plate trenches 102 above the field plate 125 and separated by the gate dielectric 130.

An n-type source region 134, which can be doped N+, is disposed abutting the gate dielectric layer 130 and the p-body region 132 abuts the vertical drift region 108. A p-type body contact region 136 extends from the top surface 103A of the semiconductor surface layer 103 to the p-body region 132. A source electrode 140 that generally comprises a metal layer is conductively coupled to the source region 134, to the p-body contact region 136, to the polysilicon layer 124 in the dual shield field plates 125, and also to the polysilicon layer 124 in the single shield field plate 127.

The source electrode 140 may be directly and conductively coupled to a top surface of the polysilicon layer 124 as depicted in FIG. 1G. The gate 128 is conductively isolated from the source electrode 140, for example by a dielectric gate cap layer 138 as shown. The vertical trench gate MOSFET 126 may be laterally isolated from other circuitry in the semiconductor device 100, for example by the field oxide 106.

Figure 1H:
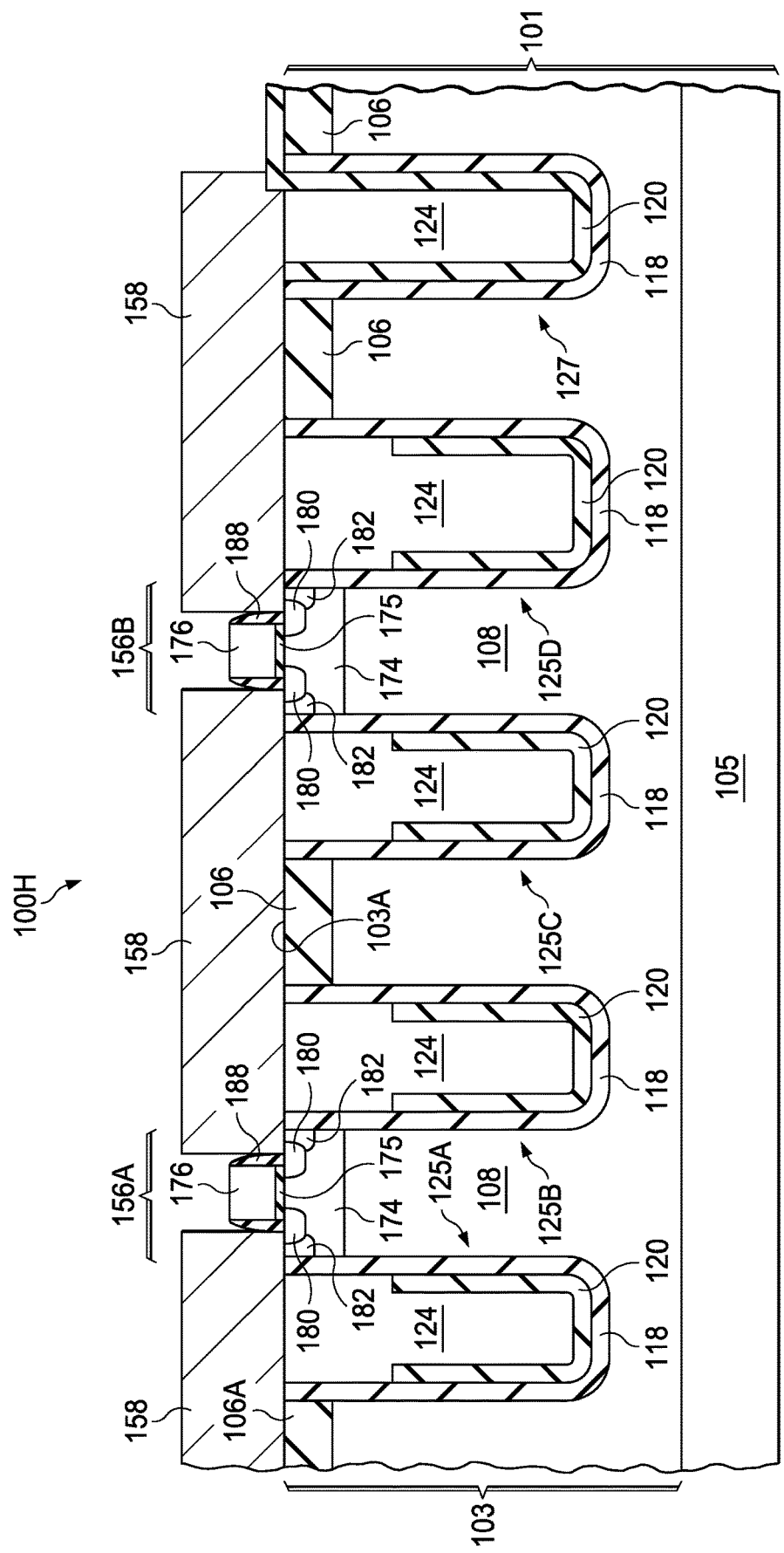

FIG. 1H depicts a cross-section of a semiconductor device 100H in which planar gate MOSFETs 156 have been formed between respective pairs of the dual shield field plates 125, e.g., a planar gate MOSFET 156A has been formed between the dual shield field plate 125A and the dual shield field plate 125B and a planar gate MOSFET 156B has been formed between the dual shield field plate 125C and the dual shield field plate 125D. Each of the planar gate MOSFETs 156 includes a gate 176 (e.g., a polysilicon gate) with sidewall spacers 188, a gate dielectric 175, a source 180, a p-body 174 and p+ body contacts 182. The source electrode 158 may again be directly and conductively coupled to a top surface of the polysilicon layer 124. The dual shield field plates 125 and the termination field plate 127 are the same as shown in FIG. 1G above.

Figure 2:
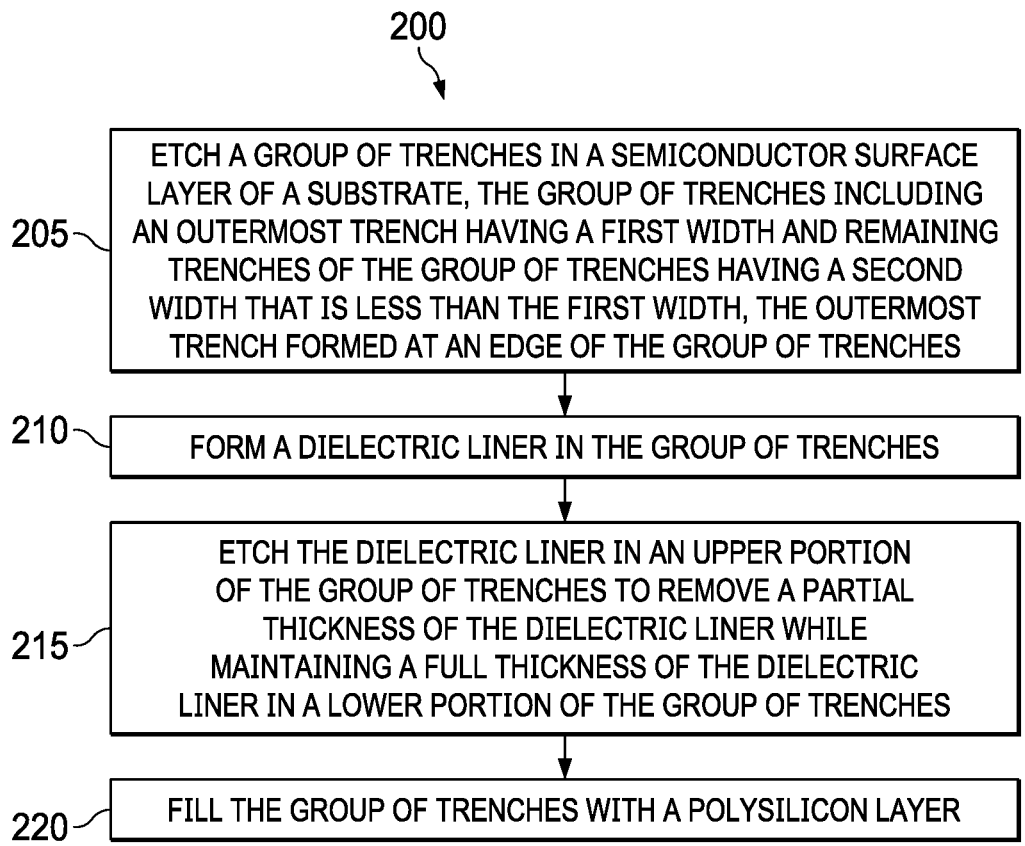
FIG. 2 depicts a method of fabricating a semiconductor device according to an implementation of the disclosure.

FIG. 2 depicts a method 200 of fabricating a semiconductor device according to an implementation of the disclosure. The method 200 includes etching 205 a group of trenches in a semiconductor surface layer of a substrate, the group of trenches including an outermost trench having a first width and remaining trenches of the group of trenches having a second width that is less than the first width, the outermost trench formed at an edge of the group of trenches. A dielectric liner is then formed 210 in the group of trenches. The dielectric liner is etched 215 in an upper portion of the group of trenches to remove a partial thickness of the dielectric liner while maintaining a full thickness of the dielectric liner in a lower portion of the group of trenches. The group of trenches are then filled 220 with a polysilicon layer.

Figure 2A:
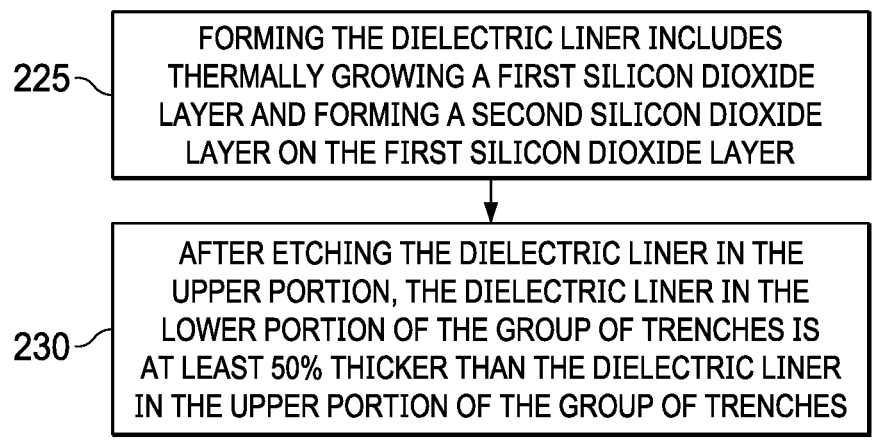
FIG. 2A through FIG. 2C depict additional elements that may be part of the method of FIG. 2.
Figures 2B, 2C:
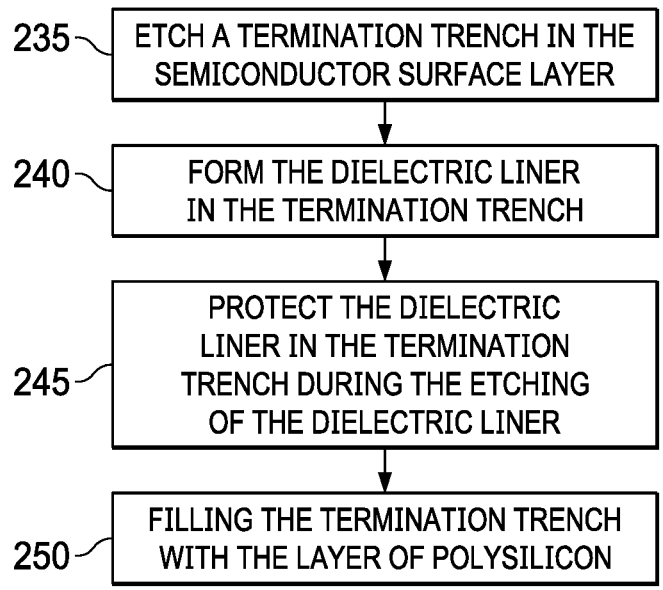

FIG. 2A through FIG. 2C each provide either further details that may be included in the method 200 or else additional elements that may be part of the method 200. FIG. 2A depicts additional details of the method 200 in which forming the dielectric liner includes thermally growing 225 a first silicon dioxide layer and forming a second silicon dioxide layer on the first silicon dioxide layer and further notes that after etching the dielectric liner in the upper portion of the group of trenches, the dielectric liner in the lower portion of the group of trenches is 230 at least 50% thicker than the dielectric liner in the upper portion of the group of trenches.

FIG. 2B depicts additional elements that may be included in the method 200, i.e., etching 235 a termination trench in the semiconductor surface layer, then forming 240 the dielectric liner in the termination trench, protecting 245 the dielectric liner in the termination trench during the etching of the dielectric liner, and filling 250 the termination trench with the polysilicon layer.

FIG. 2C depicts the additional element of forming 255 a power MOSFET between a first trench and a second trench of the group of trenches. The power MOSFET includes a drain having a drain contact, a vertical drift region in the semiconductor surface layer over the drain, and each of a gate, a body, and a source over the vertical drift region.

Figure 3:
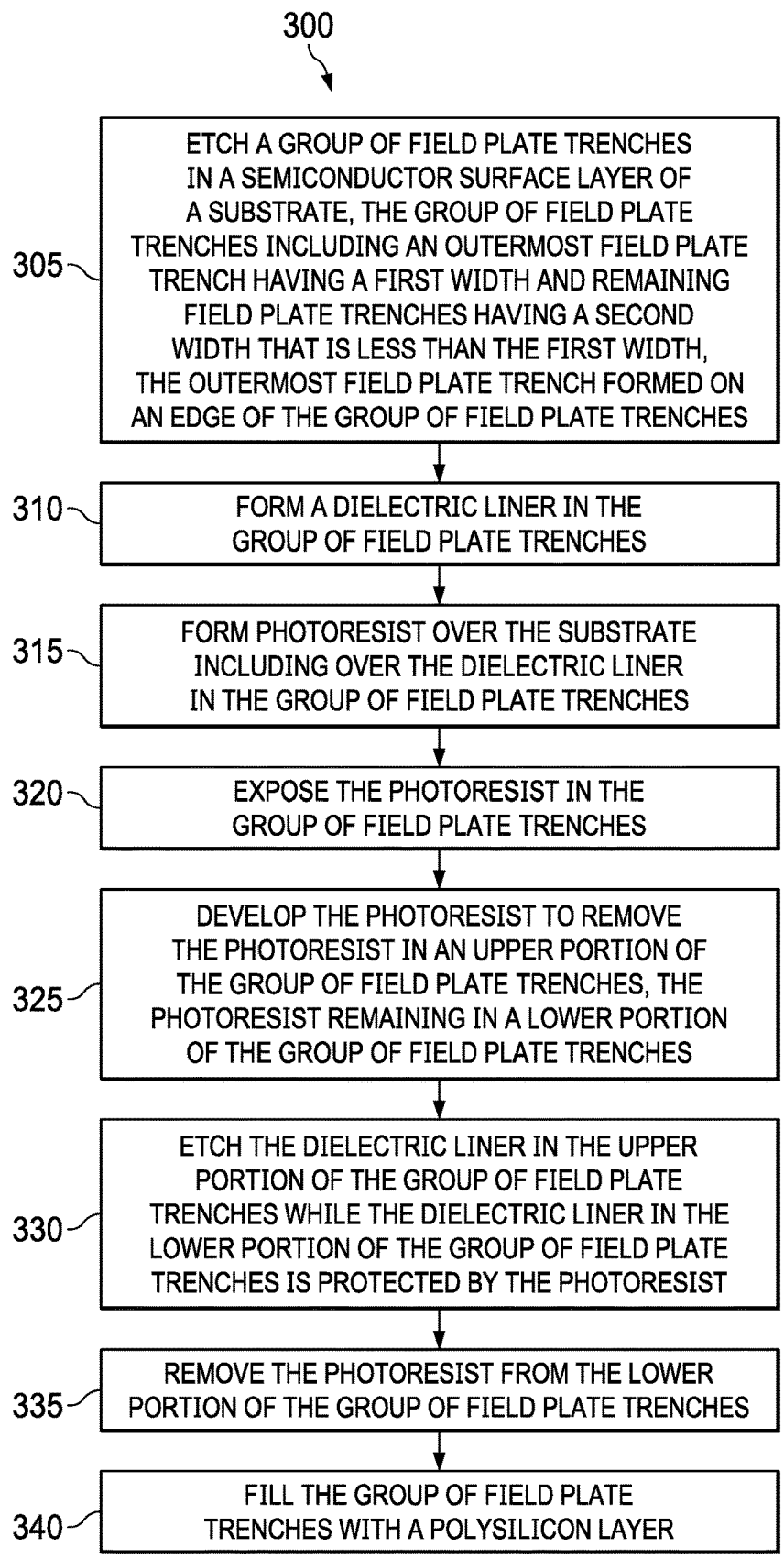
FIG. 3 depicts a method of fabricating a semiconductor device according to an implementation of the disclosure.

FIG. 3 depicts a method 300 of fabricating a semiconductor device according to an implementation of the disclosure. The method 300 includes etching 305 a group of field plate trenches in a semiconductor surface layer of a substrate. The group of field plate trenches includes an outermost field plate trench having a first width and remaining field plate trenches having a second width that is less than the first width. The outermost field plate trench is formed on an edge of the group of field plate trenches. A dielectric liner is formed 310 in the group of field plate trenches and photoresist is formed 315 over the substrate including over the dielectric liner in the group of field plate trenches. The photoresist in the group of field plate trenches is exposed 320 and developed 325 to remove the photoresist in an upper portion of the group of field plate trenches. The photoresist remains in a lower portion of the group of field plate trenches. The dielectric liner in the upper portion of the group of field plate trenches is etched 330 while the dielectric liner in the lower portion of the group of field plate trenches is protected by the photoresist. The photoresist is then removed 335 from the lower portion of the group of field plate trenches and the group of field plate trenches are filled 340 with a polysilicon layer.

Figure 3A:
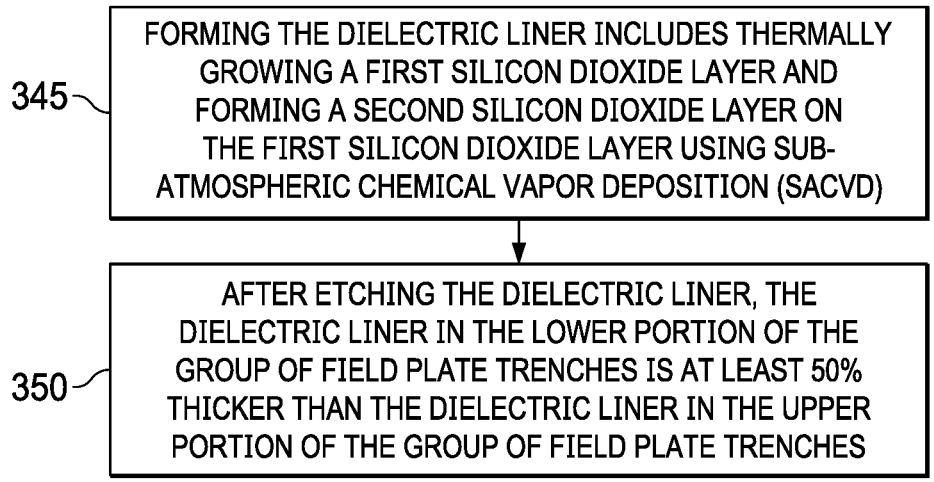
FIG. 3A through FIG. 3C depict additional elements that may be part of the method of FIG. 3.

FIG. 3A further defines that forming the dielectric liner includes 345 thermally growing a first silicon dioxide layer and forming a second silicon dioxide layer on the first silicon dioxide layer using SACVD. Additionally, after etching the dielectric liner, the dielectric liner in the lower portion of the group of field plate trenches is 350 at least 50% thicker than the dielectric liner in the upper portion of the group of field plate trenches.

Figure 3B:
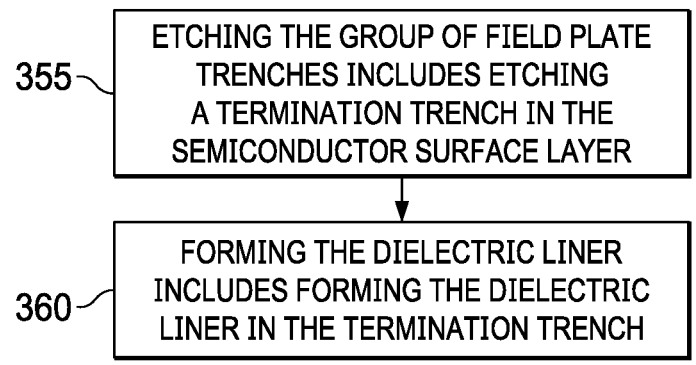
Figure 3C:
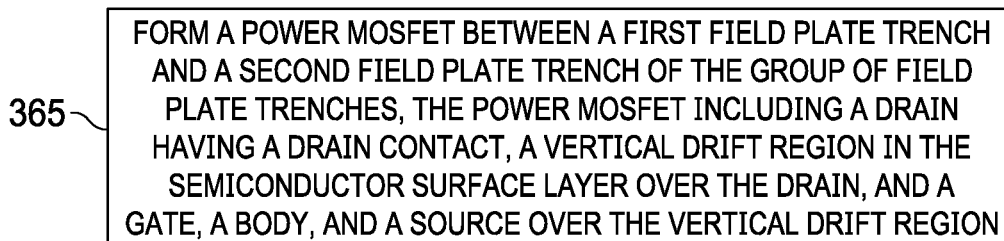

FIG. 3B defines that etching the group of field plate trenches includes etching 355 a termination trench in the semiconductor surface layer and that forming the dielectric liner includes forming 360 the dielectric liner in the termination trench. FIG. 3C adds to method 300 the element of forming 365 a power MOSFET between a first field plate trench and a second field plate trench of the group of field plate trenches. The power MOSFET includes a drain having a drain contact, a vertical drift region in the semiconductor surface layer over the drain, and a gate, a body, and a source over the vertical drift region Applicant has disclosed a semiconductor device and a method of fabricating the semiconductor device, which includes dual shield field plates designed to operate at high voltages, e.g., in the range of 75-150 V. In one implementation, the semiconductor device may be designed to operate at 100 V. The described method is expected to minimize or eliminate defects caused by photoresist pullback in the outermost of the dual shield field plates by increasing the width of the outermost trench used to form the dual shield field plates.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and ae intended to be encompassed by the present claims. Accordingly, those skilled in the art will recognize that the exemplary implementations described herein can be practiced with various modifications and alterations within the spirit and scope of the claims appended below.

What is claimed is:

1. A method of fabricating a semiconductor device, the method comprising:
   etching a group of trenches in a semiconductor surface layer of a substrate, the group of trenches including an outermost trench having a first width and remaining trenches of the group of trenches having a second width that is less than the first width, the outermost trench formed at an edge of the group of trenches;
   forming a dielectric liner in the group of trenches;
   etching the dielectric liner in an upper portion of the group of trenches to remove a partial thickness of the dielectric liner while maintaining a full thickness of the dielectric liner in a lower portion of the group of trenches; and
   filling the group of trenches with a polysilicon layer.

2. The method as recited in claim 1 in which the first width is at least 1.5 times the second width.

3. The method as recited in claim 2 in which:
   forming the dielectric liner includes thermally growing a first silicon dioxide layer and forming a second silicon dioxide layer on the first silicon dioxide layer; and
   after etching the dielectric liner in the upper portion, the dielectric liner in the lower portion of the group of trenches is at least 50% thicker than the dielectric liner in the upper portion of the group of trenches.

4. The method as recited in claim 3 including:
   etching a termination trench in the semiconductor surface layer;
   forming the dielectric liner in the termination trench;
   protecting the dielectric liner in the termination trench during the etching of the dielectric liner; and
   filling the termination trench with the polysilicon layer.

5. The method as recited in claim 3 including forming a power metal-oxide-semiconductor field effect transistor (MOSFET) between a first trench and a second trench of the group of trenches, the power MOSFET including a drain having a drain contact, a vertical drift region in the semiconductor surface layer over the drain, and a gate, a body, and a source over the vertical drift region.

6. The method as recited in claim 1 in which the first width is between 1.5 and 2.5 times the second width.

7. A method of fabricating a semiconductor device, the method comprising:
   etching a group of field plate trenches in a semiconductor surface layer of a substrate, the group of field plate trenches including an outermost field plate trench having a first width and remaining field plate trenches of the first group of field plate trenches having a second width that is less than the first width, the outermost field plate trench formed on an edge of the group of field plate trenches;
   forming a dielectric liner in the group of field plate trenches;
   forming photoresist over the substrate including over the dielectric liner in the group of field plate trenches;
   exposing the photoresist in the group of field plate trenches;
   developing the photoresist to remove the photoresist in an upper portion of the group of field plate trenches, the photoresist remaining in a lower portion of the group of field plate trenches;
   etching the dielectric liner in the upper portion of the group of field plate trenches while the dielectric liner in the lower portion of the group of field plate trenches is protected by the photoresist;
   removing the photoresist from the lower portion of the group of field plate trenches; and
   filling the group of field plate trenches with a polysilicon layer.

8. The method as recited in claim 7 in which:
   forming the dielectric liner includes thermally growing a first silicon dioxide layer and forming a second silicon dioxide layer using sub-atmospheric chemical vapor deposition (SACVD); and
   after etching the dielectric liner, the dielectric liner in the lower portion of the group of field plate trenches is at least 50% thicker than the dielectric liner in the upper portion of the group of field plate trenches.

9. The method as recited in claim 8 in which:
   etching the group of field plate trenches includes etching a termination trench in the semiconductor surface layer; and
   forming the dielectric liner includes forming the dielectric liner in the termination trench.

10. The method as recited in claim 9 in which the termination trench is covered with the photoresist during etching the dielectric liner.

11. The method as recited in claim 8 including forming a power metal-oxide-semiconductor field effect transistor (MOSFET) between a first field plate trench and a second field plate trench of the group of field plate trenches, the power MOSFET including a drain having a drain contact, a vertical drift region in the semiconductor surface layer over the drain, and a gate, a body, and a source over the vertical drift region.

12. The method as recited in claim 11 in which forming the power MOSFET includes forming a vertical trench gate MOSFET.

13. The method as recited in claim 11 in which forming the power MOSFET includes forming a planar gate MOSFET.

14. A semiconductor device comprising:
    a group of polysilicon dual shield field plates formed in a semiconductor layer of a substrate, an outermost one of the dual shield field plates having a first width at a surface of the semiconductor layer and remaining ones of the dual shield field plates having a second width at a surface of the semiconductor layer that is less than the first width; and
    a polysilicon single shield field plate formed in the semiconductor layer and forming a terminating field plate, the outermost one of the dual shield plates located between the polysilicon single shield field plate and the remaining dual shield field plates, the single shield field plate having a third width at a surface of the semiconductor layer, the third width less than the first width.

15. The semiconductor device as recited in claim 14 in which the third width is equal to the second width.

16. The semiconductor device as recited in claim 14 in which the dual shield field plates are located within trenches, each of the trenches including a first dielectric layer in an upper portion of the trench and both the first dielectric layer and a second dielectric layer in a lower portion of the trench.

17. The semiconductor device as recited in claim 16 including a power metal-oxide-silicon field effect transistor (MOSFET) formed between a first dual shield field plate and a second dual shield field plate of the group of dual shield field plates, the power MOSFET including a drain having a drain contact, a vertical drift region in the semiconductor surface layer over the drain, and a gate, a body, and a source over the vertical drift region.

18. The semiconductor device as recited in claim 17 in which the power MOSFET is a vertical trench gate MOSFET.

19. The semiconductor device as recited in claim 17 in which the power MOSFET is a planar gate MOSFET.

20. The semiconductor device as recited in claim 14 in which the first width is at least 1.5 times the second width.

21. The semiconductor device as recited in claim 20 in which the first width is between 1.5 and 2.5 times the second width.

* * * * *